United States Patent
Van Zyl et al.

(10) Patent No.: US 9,490,353 B2
(45) Date of Patent: Nov. 8, 2016

(54) THREE TERMINAL PIN DIODE

(71) Applicant: Advanced Energy Industries, Inc., Fort Collins, CO (US)

(72) Inventors: Gideon Van Zyl, Fort Collins, CO (US); Gennady G. Gurov, Loveland, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 14/010,599

(22) Filed: Aug. 27, 2013

(65) Prior Publication Data
US 2014/0167835 A1 Jun. 19, 2014

Related U.S. Application Data

(60) Provisional application No. 61/694,205, filed on Aug. 28, 2012.

(51) Int. Cl.
| | |
|---|---|
| *H01L 29/737* | (2006.01) |
| *H03K 17/68* | (2006.01) |
| *H01L 29/36* | (2006.01) |
| *H01L 29/66* | (2006.01) |
| *H01L 29/73* | (2006.01) |
| *H01L 29/08* | (2006.01) |

(52) U.S. Cl.
CPC ......... *H01L 29/737* (2013.01); *H01L 29/0821* (2013.01); *H01L 29/36* (2013.01); *H01L 29/66234* (2013.01); *H01L 29/73* (2013.01); *H03K 17/68* (2013.01)

(58) Field of Classification Search
USPC ........................................................ 257/593
See application file for complete search history.

(56) References Cited

U.S. PATENT DOCUMENTS

| | | | |
|---|---|---|---|
| RE27,045 E | * | 2/1971 | Yu .................................. 257/593 |
| 8,416,008 B2 | | 4/2013 | Van Zyl et al. |
| 2006/0119433 A1 | * | 6/2006 | Proehl ....................... H03F 1/08 330/295 |
| 2011/0260292 A1 | * | 10/2011 | Lin et al. ...................... 257/565 |

FOREIGN PATENT DOCUMENTS

| | | |
|---|---|---|
| JP | 63258110 A | 10/1988 |
| JP | 11-177401 | 7/1999 |
| JP | 2000512460 A | 9/2000 |

(Continued)

OTHER PUBLICATIONS

Cheng, Diana, "Office Action re U.S. Appl. No. 13/786,813", Apr. 10, 2014, p. 32, Published in: US.

(Continued)

*Primary Examiner* — Robert Carpenter
(74) *Attorney, Agent, or Firm* — Neugeboren O'Dowd PC

(57) ABSTRACT

This disclosure describes a switch having a collector, base, emitter, and an intrinsic region between the collector and base. The intrinsic region increases the efficiency of the switch and reduces losses. The collector, base, and emitter each have respective terminals, and an AC component of current passing through the base terminal is greater than an AC component of current passing through the emitter terminal. Additionally, in an on-state a first alternating current between the base and collector terminals is greater than a second alternating current between the collector and emitter terminals. In other words, AC passes primarily between collector and base as controlled by a DC current between the base and emitter.

22 Claims, 10 Drawing Sheets

(56) References Cited

FOREIGN PATENT DOCUMENTS

| JP | 2003086602 | | 3/2003 |
|---|---|---|---|
| JP | 2003115549 | A | 4/2003 |
| JP | 2004027339 | A | 1/2004 |
| JP | 2004085446 | A | 3/2004 |

OTHER PUBLICATIONS

Cheng, Diana, "Office Action re U.S. Appl. No. 13/010,647", Aug. 16, 2012, p. 18, Published in: US.
Cheng, Diana, "Office Action re U.S. Appl. No. 13/786,813", Sep. 18, 2013, p. 26, Published in: US.
Mitrovic, Bayer, "International Search Report and Written Opinion re Application No. PCT/US12/21114", Feb. 22, 2012, Published in: AU.
Bai, Lingfei, "International Preliminary Report on Patentability re Application No. PCT/US2012/021114", Aug. 1, 2013, p. 7, Published in: CH.
Gruber, Stephen S., "Response to Office Action re U.S. Appl. No. 13/786,813", Sep. 10, 2014, p. 20, Published in: US.
Gruber, Stephen S., "Response to Office Action re U.S. Appl. No. 13/010,647", Nov. 12, 2012, p. 13, Published in: US.
Gruber, Stephen S., "Response to office Action re U.S. Appl. No. 13/786,813", Dec. 13, 2013, p. 12, Published in: US.
Sokal, Nathan O., "Class-E RF Power Amplifiers", "QEX", Jan. 2, 2001, pp. 9-20, Publisher: ARRL—American Radio-Relay League, Published in: US.
Huber, et al., "InP/InGaAs Single HBT Technology for Photoreceiver OEIC's at 40 Gb/s and Beyond", Aug. 2000, p. 8, Publisher: IEEE Journal of Lightware Technology, Published in: US.
Dixit, Arpit, "International Search Report and Written Opinion re Application No. PCT/US2013/056895", Aug. 13, 2014, p. 9, Published in: AU.
Moon, Kihwan, "International Preliminary Report on Patentability re Application No. PCT/US2013/056895", Mar. 12, 2015, p. 6, Published in: CH.
Cheng, Diana, "Office Action re U.S. Appl. No. 13/786,813", Dec. 4, 2014, p. 22, Published in: US.
Fujimoto, "Japanese Office Action re Application No. 2013-550502", Dec. 16, 2014, p. 9, Published in: JP.
Gruber, Stephen S., "Response to Office Action re U.S. Appl. No. 13/786,813", Feb. 4, 2015, p. 16, Published in: US.
Cheng, Wilson, Response to Taiwan Office Action re Application No. 102130986, Jul. 20, 2016, p. 32, Published in: TW.
TIPO, Taiwan Office Action and Search Report re Application No. 102130986, May 30, 2016, p. 11 Published in: TW.

\* cited by examiner

THREE TERMINAL PIN DIODE

CLAIM OF PRIORITY UNDER 35 USC §119

The present Application for Patent claims priority to Provisional Application No. 61/694,205 entitled "THREE TERMINAL PIN" filed Aug. 28, 2012, and assigned to the assignee hereof and hereby expressly incorporated by reference herein.

FIELD OF THE INVENTION

The present invention relates generally to electronic devices. In particular, but not by way of limitation, the present invention relates to systems, methods and apparatuses for a three terminal PIN diode.

BACKGROUND OF THE INVENTION

Some impedance matching devices, especially those used to impedance match power supplies to plasma processing chambers, include a plurality of capacitors of varying capacitance where different combinations of capacitors are switched in and out of the match in order to tune the match. The capacitors can be switched in and out of the match via switches such as bipolar junction transistors (BJTs) and insulated gate bipolar transistors (IGBTs).

SUMMARY

This disclosure describes systems, methods, and apparatuses for a three terminal PIN diode. Alternatively, this can be described as a BJT with an intrinsic region between the collector and base, or a BJT with an intrinsic region in the collector adjacent to the base. Either way, the device acts as a switch for alternating current (AC) or radio frequency (RF) current between the collector and base terminals. The switch is controlled via applying a direct current (DC) bias between the base terminal and the emitter terminal, where a polarity of the bias depends on the doping configuration of the switch. In some alternatives, a doped layer can be arranged between the base and the intrinsic region, or between the intrinsic region and the collector. In yet further alternatives, doped layers can be arranged on both sides of the intrinsic region.

In one aspect of this disclosure, a switch is disclosed comprising a collector, an emitter, a base, and an intrinsic region. The collector can have a collector terminal, the emitter can have an emitter terminal, and the base can have a base terminal. The base can be coupled to the emitter at a base-emitter junction and the intrinsic region can be arranged between the base and the collector.

In another aspect of this disclosure, a method of operating a switch is disclosed. The method can include providing the switch including a base, emitter, and collector, having an intrinsic region between the collector and the base. The base can have a base terminal, the emitter can have an emitter terminal, and the collector can have a collector terminal. The method can further include conducting a first current between the collector terminal and the base terminal. The first current can have an alternating current component with a first amplitude. The method can further include conducting a second current between the collector terminal and the emitter terminal. The second current can have an alternating current component with a second amplitude. The method can yet further include conducting a third current between the base terminal and the emitter terminal and controlling the first current via the third current.

Another aspect of this disclosure describes another switch comprising a collector, an emitter, a base, and an intrinsic region. The collector can have a collector terminal, the emitter can have an emitter terminal, and the base can have a base terminal. The base can be coupled to the emitter via a base-emitter junction. The intrinsic region can be arranged between the base and the collector. An amplitude of alternating current passing through the base terminal is greater than an amplitude of alternating current passing through the emitter terminal.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

DETAILED DESCRIPTION

Figure 1:
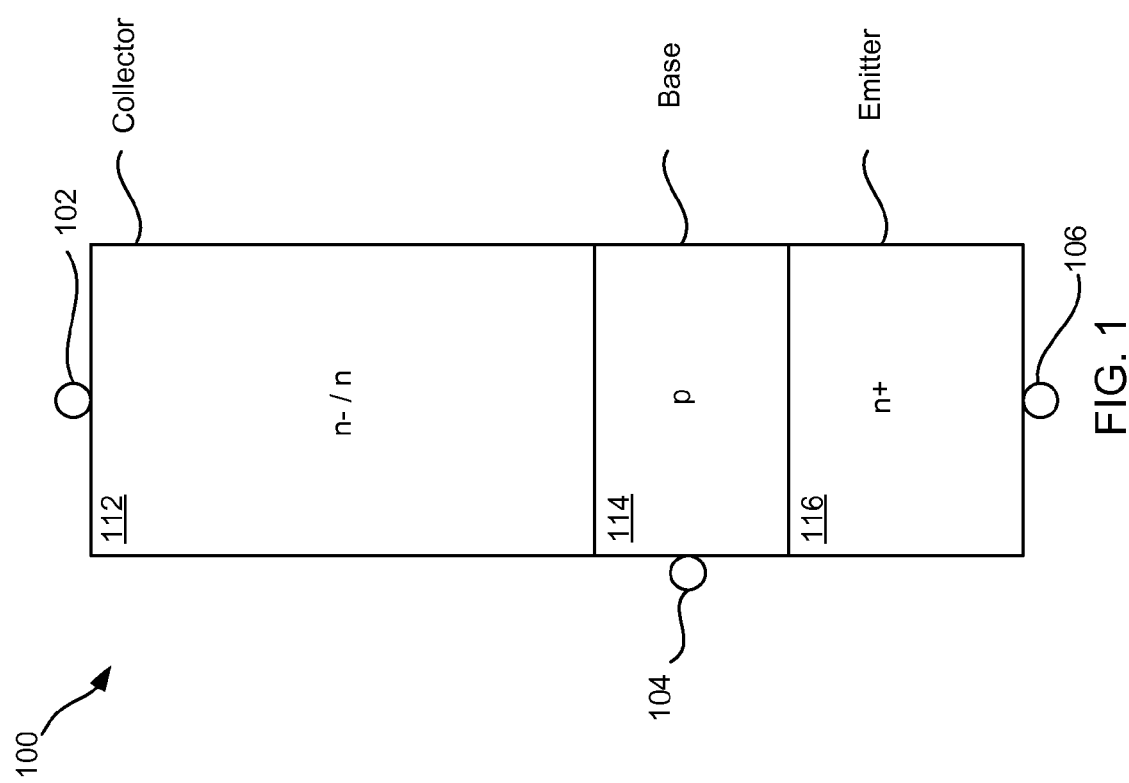
FIG. 1 illustrates an n-p-n BJT where AC current passes primarily between collector and base terminals.

Typically, a BJT operated as a switch controls a flow of DC current between a collector and emitter, where base-emitter bias controls the flow of DC current between the collector and emitter. In this known mode of operation the base current is used as a control current and is a fraction of the current that is conducted between collector and emitter in the on-state of the switch. In this normal configuration the switch uses cutoff as the off-state (appears as an open circuit) and saturation as the on-state (appears as a short circuit). This disclosure describes a new way of operating the BJT as a switch where a small base-emitter current is used to control a larger collector-base current. Further, this patent describes a new 3-terminal PIN device incorporating an intrinsic region between collector and base of a BJT in order to obtain a better switch for AC or RF current. It was experimentally found that a small DC applied between the base and emitter can control a large AC current between collector and base. In this mode the on-state losses are remarkably low and it is believed that the operation of the device in this mode is similar to that of a PIN diode where the AC current sweeps injected carriers in the collector and base regions back and forth and the DC emitter current keeps the collector and base regions supplied with carriers. If the DC emitter current is interrupted and the collector-base junction reverse biased, then the current between collector and base can be interrupted. The reverse bias widens a depletion region at the base-collector junction, and this region acts like a low capacitance capacitor, thus enabling low off-state losses. So, a BJT operated in the switching mode disclosed herein achieves the low losses and high current-carrying capacity of a PIN diode in the on-state and the low leakage current and high voltage capacity of a PIN diode in the off-state. However, it does so via a three-terminal device, thus avoiding the complex isolation circuitry that a PIN diode requires to isolate the DC control signal from the RF signal. This disclosure concerns enhancements to the basic BJT structure to turn the device into a 3-terminal PIN by incorporating an intrinsic region between collector and base of a BJT. It is foreseen that the inclusion of an intrinsic region will further reduce off-state losses and improve upon the performance when the device is used as a switch for AC or RF current.

As noted, it is possible that the collector-base junction functions like a PIN diode when operated in this mode, but unlike a PIN diode in which a small DC current needs to flow between cathode and anode to keep the device on, no DC current need flow through the collector of the BJT operating in this mode; rather the current necessary to keep the device on can be supplied through the emitter. In order to enhance the PIN-like qualities of this BJT, an intrinsic region can be arranged between the collector and base. Incorporating an intrinsic region between collector and base should reduce the off state losses associated with using a regular BJT as a switch for AC or RF current between collector and base. Specifically, in the off state the intrinsic region should keep the off-state capacitance low even when the base junction has a small reverse bias during part of the AC or RF cycle unlike a normal BJT where this capacitance is strongly modulated by the applied AC or RF voltage.

FIG. 1 illustrates an n-p-n BJT where AC current passes primarily between collector and base terminals. The BJT 100 includes a base 114 arranged between a collector 112 and an emitter 116. The collector 112 can include a collector terminal 102; the base 114 can include a base terminal 104; and the emitter 116 can include an emitter terminal 106. In an n-p-n configuration, the collector 112 can be doped so as to be n-type, the base 114 can be doped so as to be p-type, and the emitter 116 can be doped so as to be n-type. In the illustrated embodiment, the collector 112 can be lightly doped (n−) and the emitter 116 can be heavily doped (n++), although other doping levels can also be implemented.

Figure 2:
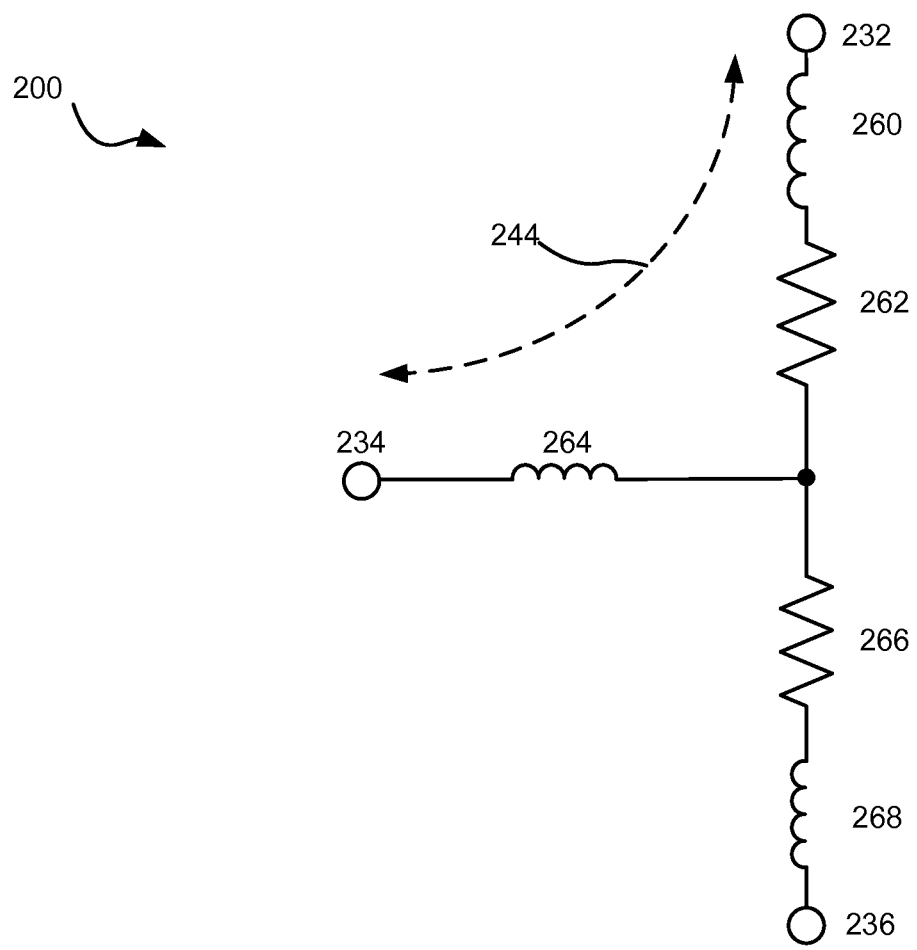
FIG. 2 illustrates an empirically-derived model of an n-p-n BJT operated in an on-state.

FIG. 2 illustrates an empirically-derived model of an n-p-n BJT operated in an on-state. The model 200 predicts that AC current 244 passing between the collector terminal 232 and the base terminal 234 will encounter a resistance 262 ($R_1$), an inductance 260 and an inductance 264. AC current passing from the collector terminal 232 to the emitter terminal 236 will encounter a resistance 262 ($R_1$) and 266 ($R_2$) and inductances 260 and 268. The model 200 is only applicable for AC current and therefore DC currents are not illustrated.

Traditionally an n-p-n BJT in saturation (the traditional 'on-state') is operated such that a current from base terminal to emitter terminal controls the on/off-state of the BJT by allowing or preventing current from passing from the collector terminal to the emitter terminal. In contrast, in this disclosure a current from the base terminal 234 to the emitter terminal 236 controls the on/off-state of the BJT 200 by allowing or preventing AC or RF current from passing from the collector terminal 232 to the base terminal 234. Additionally, the losses associated with passing an AC current between the collector terminal 232 and the emitter terminal 236 can be substantially reduced by instead passing the AC current 244 between the collector terminal 232 and the base terminal 234. This is because for AC current passing from the collector terminal 232 to the emitter terminal 236 there are losses due to both resistances 262 ($R_1$) and 266 ($R_2$). For AC current 244 passing from the collector terminal 232 to the base terminal 234, there are only losses due to resistance 262 ($R_1$). Thus, on-state losses can be significantly reduced by passing AC current 244 between the collector terminal 232 and the base terminal 234.

Although illustrated and described as an n-p-n type BJT the switch 200 can also be a p-n-p type. In other words, the collector can be doped so as to be a p-type semiconductor, the base can be doped so as to be an n-type semiconductor, and the emitter can be doped so as to be a p-type semiconductor.

Figure 3:
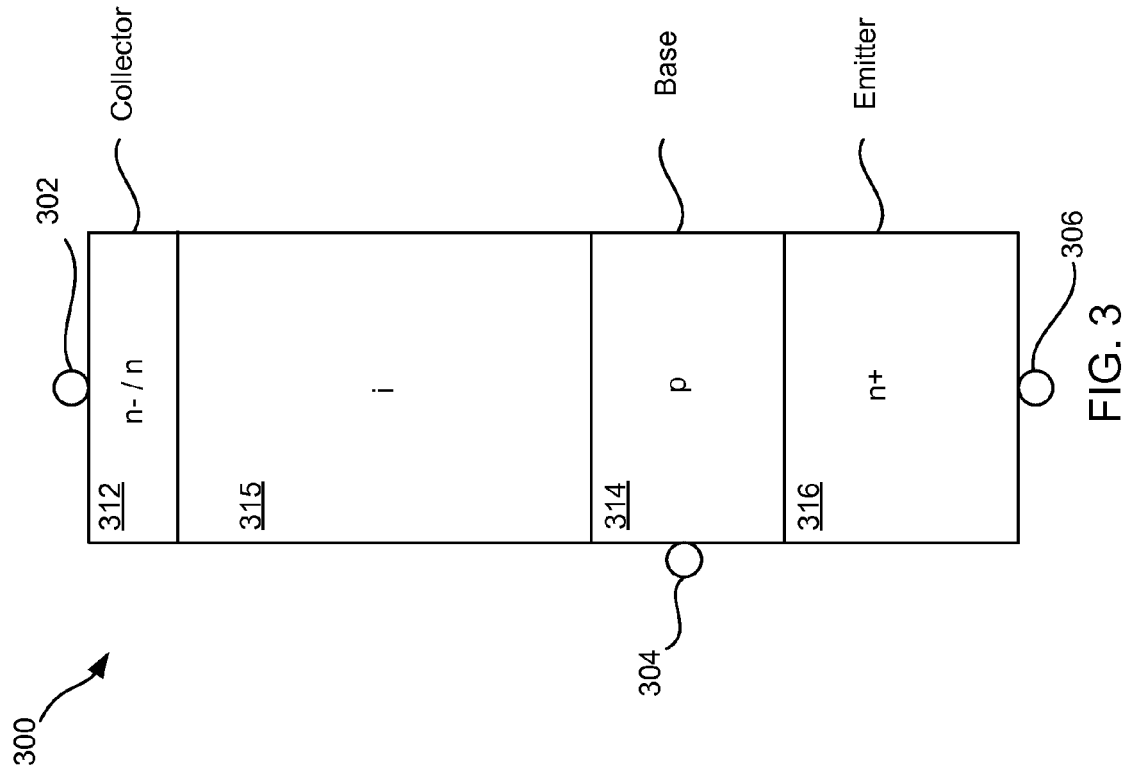
FIG. 3 illustrates a 3-terminal PIN consisting of an n-p-n BJT having an intrinsic region between the collector and base where AC current passes primarily between collector and base terminals.

FIG. 3 illustrates an 3-terminal PIN consisting of an n-p-n BJT having an intrinsic region between the collector and base where AC current passes primarily between collector and base terminals. The 3-terminal PIN 300 includes a collector 312, a base 314, an emitter 316, and an intrinsic region 315 arranged between the collector 312 and the base 314. The collector 312 can include a collector terminal 302; the base 314 can include a base terminal 304; and the emitter 316 can include an emitter terminal 306. The inclusion of the intrinsic region 315 makes the base 314, intrinsic region 315, and collector 312 form a PIN junction. In an n-p-n configuration, the collector 312 can be doped so as to be n-type, the base 314 can be doped so as to be p-type, and the emitter 316 can be doped so as to be n-type. In the illustrated embodiment, the collector 312 can be lightly doped (n−) and the emitter 316 can be heavily doped (n++), although other doping levels can be implemented.

The intrinsic region 315 is not drawn to scale. Thus, in some embodiments it may be larger than the collector 312, larger than the base 304, and/or larger than the emitter 316. In other embodiments, the intrinsic region 315 can be smaller than the collector 312, smaller than the base 314, and/or smaller than the emitter 316.

BJTs often have lightly doped collectors (e.g., n−). Lighter collector doping enables a larger collector-base depletion region, and a larger depletion region means that the reverse bias voltage drops across a larger span and thus a lower electric field is seen in the depletion region. Lower electric field means that larger reverse bias voltages can be applied before breakdown occurs, and thus lighter doping is used to achieve higher breakdown voltages. However, for the 3-terminal PIN, since the intrinsic region 315 sets the length of the depletion region and thus the breakdown voltage a lightly doped collector 312 need not be used. Higher doping of the collector region can reduce on and off state losses when the 3-terminal PIN is used to switch AC or RF current between the collector and base.

Figure 4:
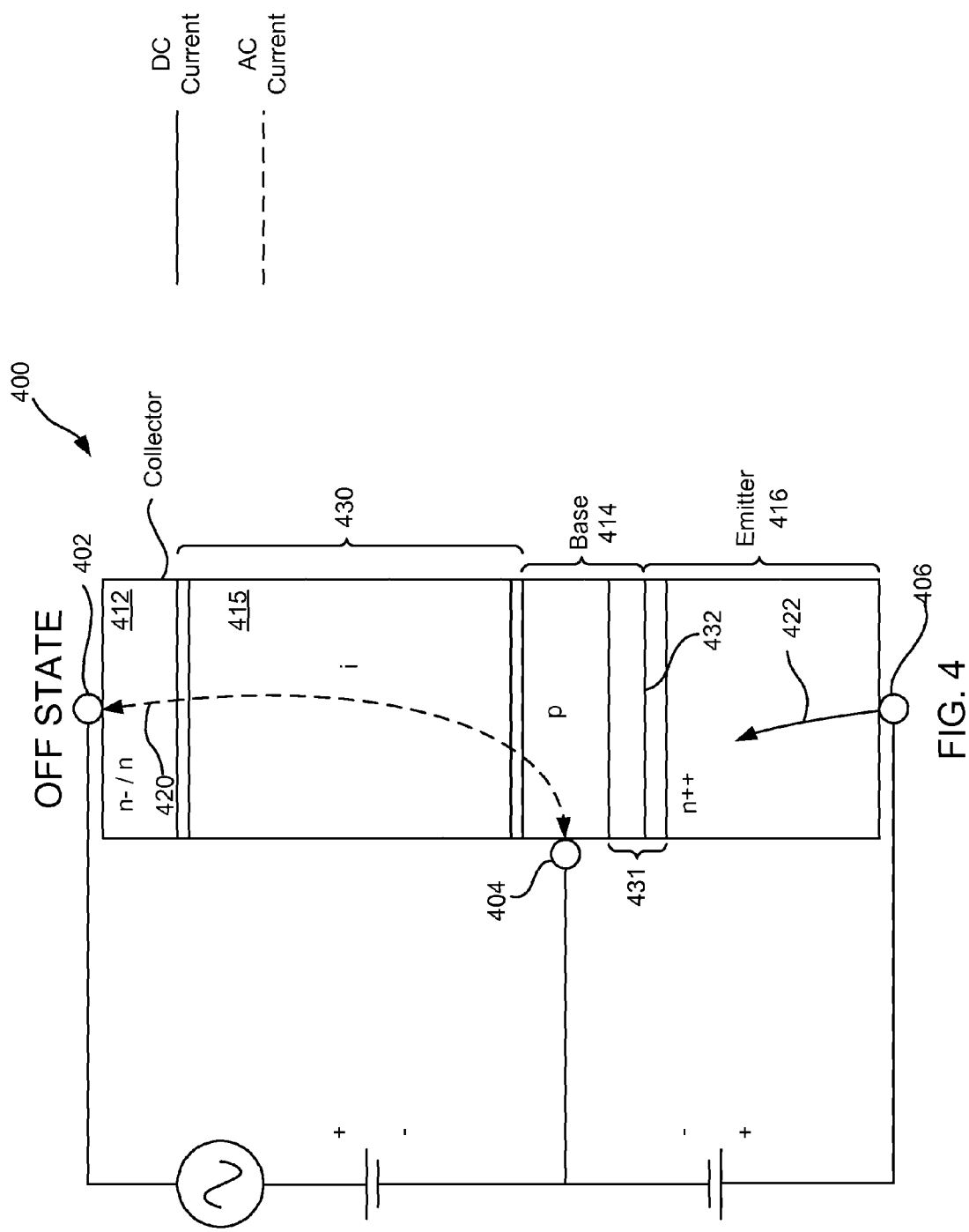
FIG. 4 illustrates a cross section of the 3-terminal PIN of FIG. 3 operated in an off-state.

FIG. 4 illustrates a cross section of the 3-terminal PIN of FIG. 3 operated in an off-state. In the off-state the PN junction 432 (the base-emitter junction) is reverse biased as is the PIN junction, which includes the base 414, intrinsic region 415, and collector 412. When reverse biased, the depletion region 430, which includes the intrinsic region 415 and portions of the collector 412 and the base 414, is substantially devoid of free carriers and thus not conductive. This depletion region 430 can be modeled as a low capacitance capacitor (e.g., a wide non-conductive gap between two conductors) and thus presents high impedance to AC or RF current 420.

The intrinsic region 415 reduces off-state losses as compared to a traditional base-collector depletion region, which has a width that is dependent on the applied reverse bias. During parts of the AC or RF cycle when the applied bias is low, the junction capacitance of the depletion region becomes large. By contrast, the depletion region 430 of the 3-terminal PIN 400 includes the intrinsic region 415 and hence the junction capacitance of the depletion region 430 remains small even at low reverse bias levels. The effective capacitance of the 3-terminal PIN can thus be made smaller than that of a traditional BJT reducing AC or RF current 420 through the device in the off state. In addition, since the collector 412 doping in the 3-terminal PIN 400 can be higher, series resistance can also be reduced. Thus, the 3-terminal PIN 400 should, for comparable on-state losses and voltage handling in the off state, have lower off-state losses than that of a traditional BJT when used as a switch for AC or RF current. Additionally, it is believed that the since the intrinsic region 415 has a smaller electric field than an equivalently biased collector-base depletion region, greater off-state voltages can be used before breakdown. In other words, a larger reverse bias can be applied before the electric field in the intrinsic region 415 is strong enough to cause physical damage to the BJT 400. For instance, a breakdown voltage between the collector terminal 402 and the base terminal 404 is at least 1000 V or at least 1600 V.

Figure 5:
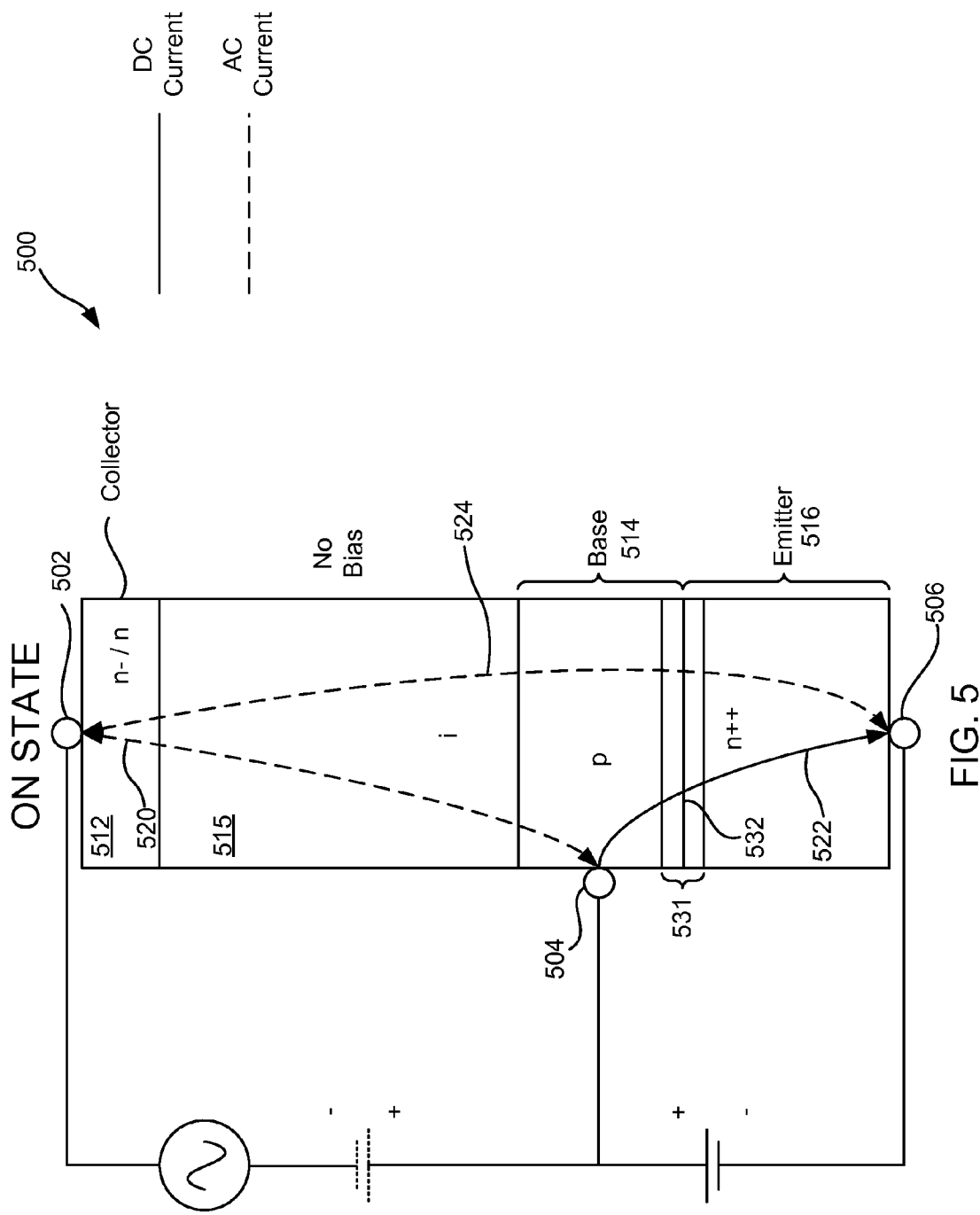
FIG. 5 illustrates a cross section of the 3-terminal PIN of FIG. 3 operated in an on-state.

FIG. 5 illustrates a cross section of the 3-terminal PIN of FIG. 3 operated in an on-state. In the on-state the base-emitter junction 532 can be forward biased with a DC current 522 from the base terminal 504 to the emitter terminal 506. The depletion region 531 is smaller than seen when no bias or a reverse bias is applied to the junction 532.

In the on-state a voltage between the base 514 and the collector 512 is essentially zero and a small DC current (not illustrated) may flow from collector terminal 502 to the base terminal 504, but this current has negligible effect on the operation of the 3-terminal PIN 500. As such, the intrinsic region 515 in the on-state can either have no bias or a small reverse or forward bias. An optional small forward bias is illustrated, but this could also be a small reverse bias or no bias.

Even where a reverse bias is applied, the AC current 520 will be orders of magnitude greater than the reverse bias and thus the reverse bias will have a negligible effect. While traditional base-collector junctions rectify AC, the illustrated intrinsic region 515 acts as a resistor for AC current since the carrier lifetimes within the intrinsic region 515 are long enough that the alternating polarity of voltage across the intrinsic region 515 does not deplete the intrinsic region 515 of carriers during any half cycle. Thus, there is no rectification and the AC current 520 passes between the collector terminal 502 and the base terminal 504 without or with negligible rectification.

In an embodiment, a collector current passing through the collector terminal 502 has an AC component having a first amplitude. Collector current is that current passing through the collector terminal 502 and is the sum of AC and DC components. A base current passes through the base terminal 504 and has an AC component having a second amplitude. Base current is that current passing through the base terminal 504 and is the sum of AC and DC components. An emitter current passes through the emitter terminal 506 and has an AC component having a third amplitude. Emitter current is that current passing through the emitter terminal 506 and is the sum of AC and DC components. The second amplitude can be greater than the third amplitude. The second amplitude can be greater than the magnitude of the DC component of the base current. The second amplitude can be at least five times greater than the third amplitude. The second amplitude can be at least five times greater than the magnitude of the DC component of the base current.

Figure 6:
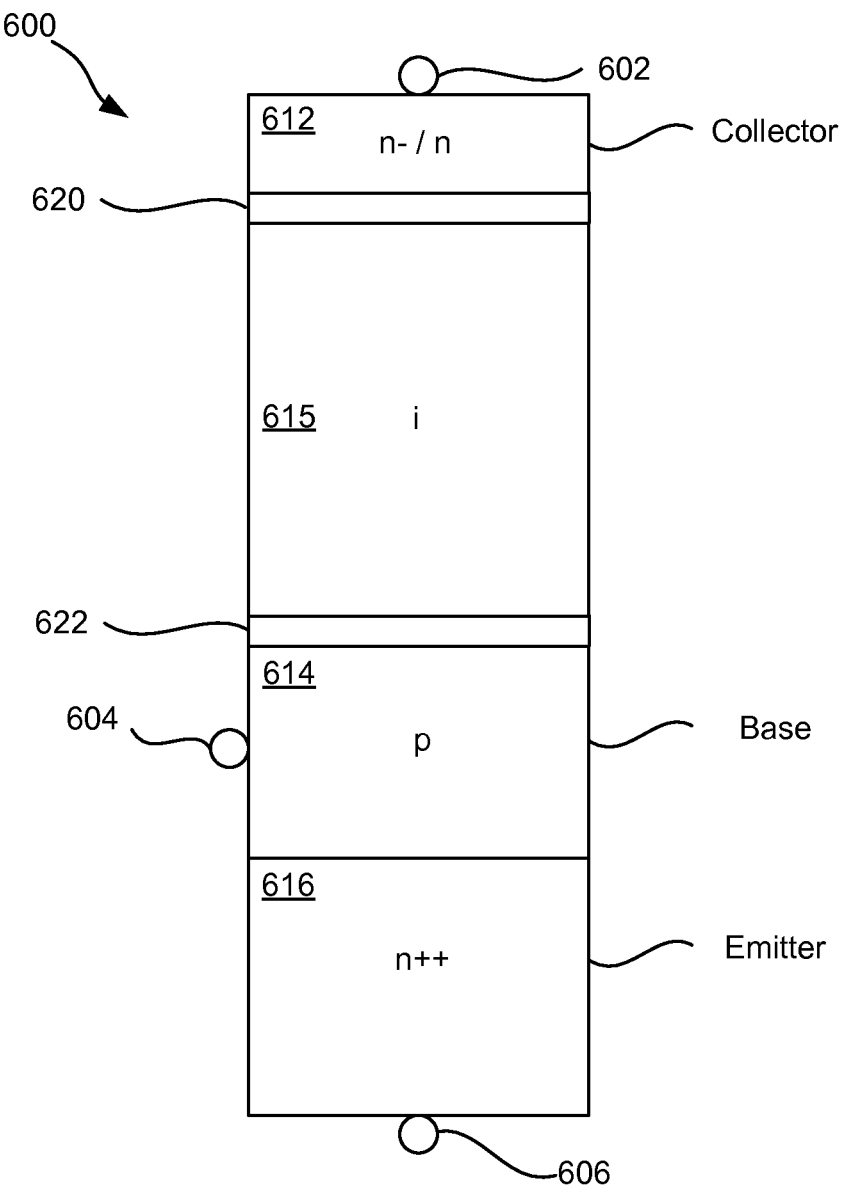
FIG. 6 illustrates an n-p-n BJT having an intrinsic region and doped layers surrounding the intrinsic region and where AC current passes primarily between collector and base terminals.

FIG. 6 illustrates an n-p-n BJT having an intrinsic region and doped layers surrounding the intrinsic region and where AC current passes primarily between collector and base terminals. The BJT 600 includes a collector 612 having a collector terminal 602, a base 614 having a base terminal 604, and an emitter 616 having an emitter terminal 606. An intrinsic region 615 is sandwiched between the collector 612 and the base 614. One or more doped layers 620, 622 are arranged between the intrinsic region 615 and the collector 612 and between the intrinsic region 615 and the base 614.

The doped layers can be n or p type and can be heavily or lightly doped. They can comprise one or more different dopants. The number of doped layers on each side of the intrinsic region 615 can be the same or different. The one or more doped layers 620, 622 can enhance free carrier injection into the intrinsic region 615, can aid with turning off the device, improve switching speed or may be a compromise between various desired device characteristics.

Figure 7:
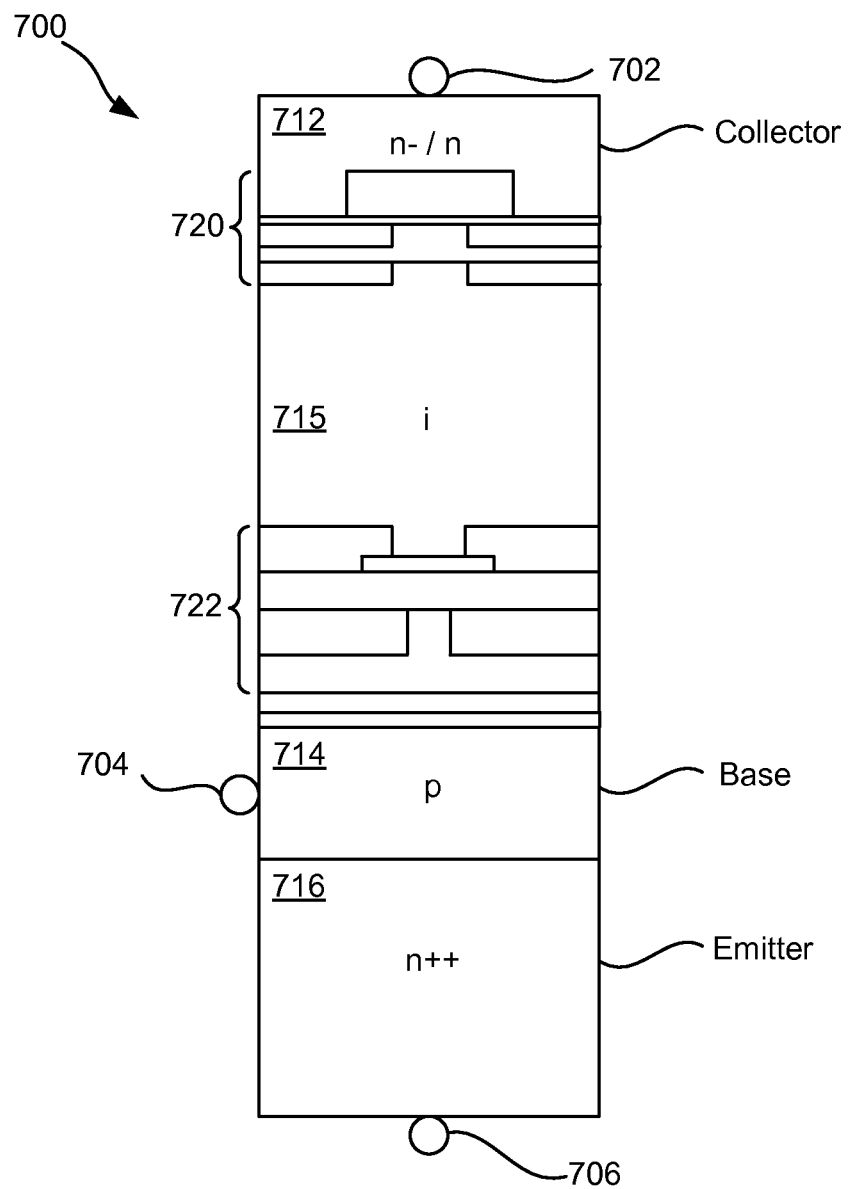
FIG. 7 illustrates doped layers 720 and 722 with two or three dimensional features incorporated in a 3-terminal PIN and where AC current passes primarily between collector and base terminals.

FIG. 7 illustrates doped layers 720 and 722 with two or three dimensional features incorporated in a 3-terminal PIN where AC current passes primarily between collector and base terminals. The one or more doped layers 720, 722 can enhance free carrier injection into the intrinsic region 715, can aid with turning off the device, improve switching speed or may be a compromise between various desired device characteristics.

Figure 8:
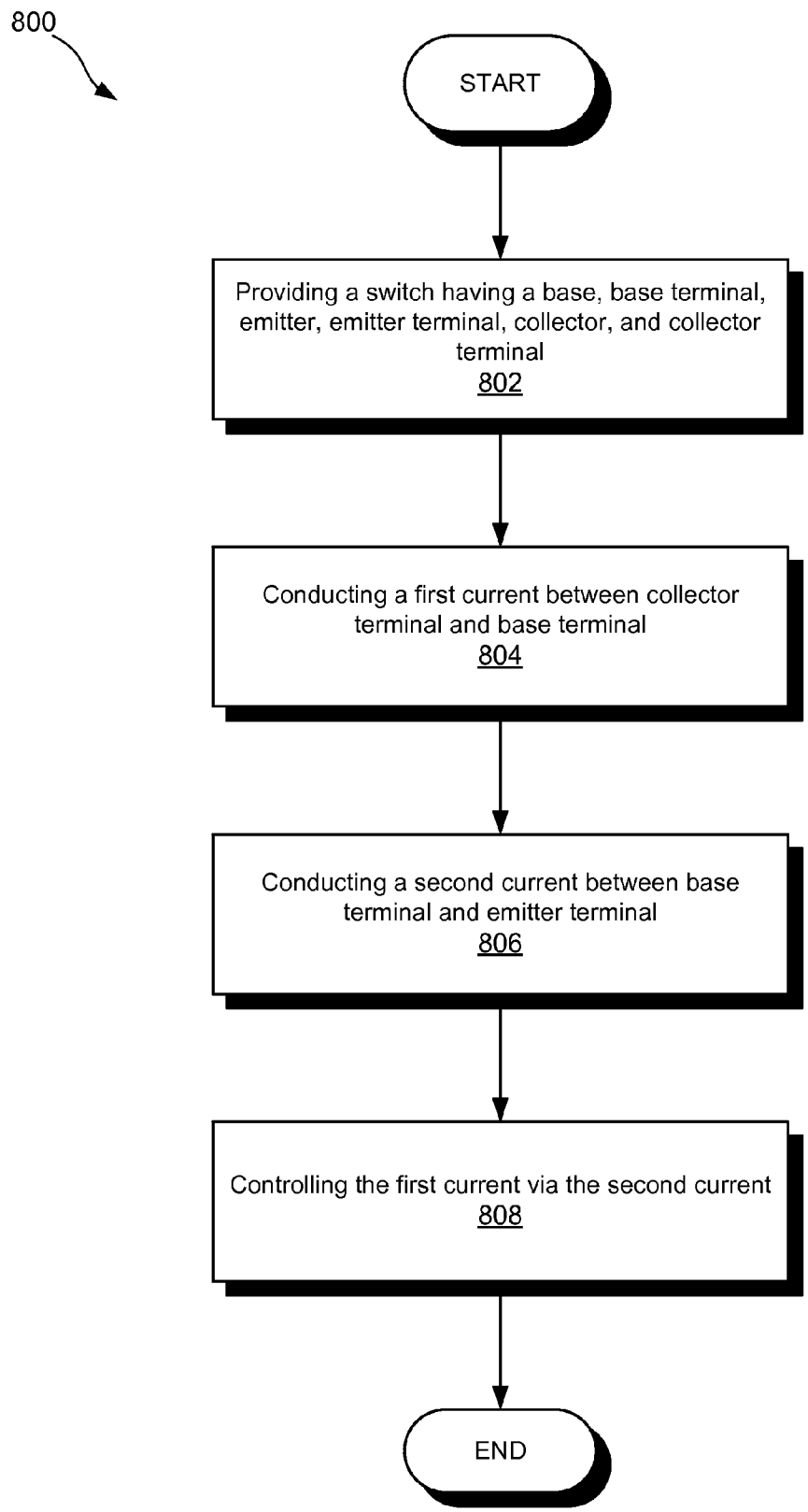
FIG. 8 illustrates a method of operating a 3-terminal PIN or BJT where AC current passes primarily between collector and base.

FIG. 8 illustrates a method of operating a BJT or 3-terminal PIN where AC current passes primarily between collector and base. The method 800 includes providing 802 a switch having a collector, base, and emitter. The collector has a collector terminal, the base has a base terminal, and the emitter has an emitter terminal. The method 800 further includes conducting 804 a first current between the collector terminal and the base terminal, wherein an AC component of this first current has a first amplitude. The method 800 further includes conducting 806 a second current between the base terminal and the emitter terminal, wherein the second current has an AC component having a second amplitude. The first amplitude can be greater than the second amplitude. Further, the first conducting 804 can be controlled by the second conducting 806. For instance, DC current, including positive, zero and negative DC current, between the base and emitter can control an amplitude of AC current between the collector and base.

What differentiates this method from the traditional use of a BJT is that here the first amplitude is greater than the second amplitude (an AC component of current in the base terminal is greater than an AC component of current in the emitter terminal). In other words, alternating current passes primarily between a collector terminal and a base terminal rather than between a collector and emitter.

Figure 9:
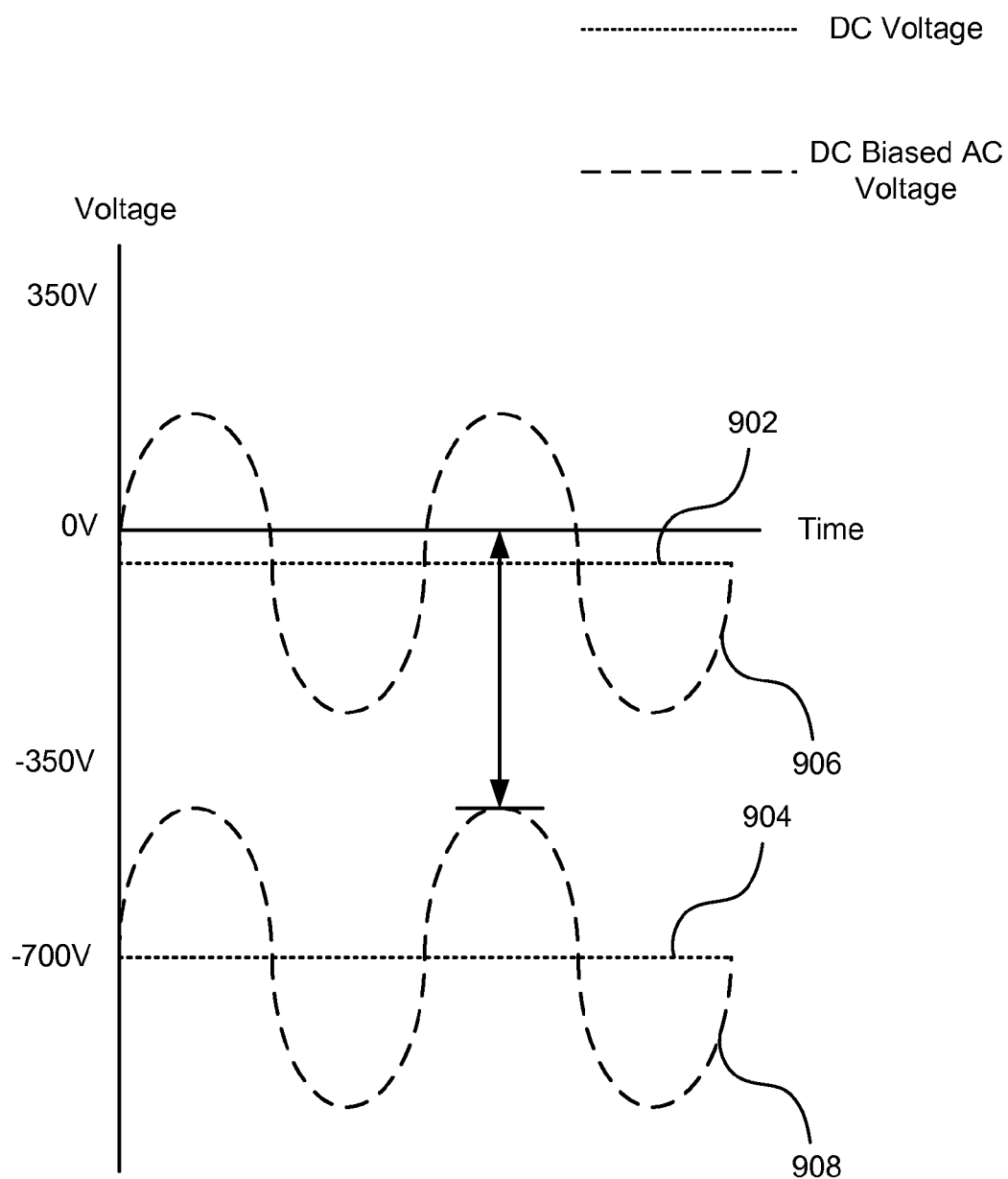
FIG. 9 illustrates a voltage versus time chart for two different reverse biases on the intrinsic region.

FIG. 9 illustrates a voltage versus time chart for two different reverse biases on the intrinsic region. If the reverse bias DC voltage 902 is negative (dotted line), but has a magnitude less than the amplitude of the AC component of the PIN junction voltage (dashed line), or the voltage across the intrinsic region, then the PIN junction will be reverse biased during the negative AC cycle, and forward biased during the positive AC cycle (negative voltage means the PIN junction is reverse biased). Thus, with only a small or negligible reverse bias on the PIN junction, the PIN junction will not remain turned off. That means the switch 300 and 600 will be partially uncontrollable.

A biasing circuit for the switch therefore preferably maintains a low enough absolute DC potential 904 across the PIN junction that the PIN junction voltage is less than 0V throughout every cycle. This is shown via the −700V DC bias 904 (dotted line) and DC-biased AC signal 908 (dashed line) centered around −700V. As seen, with such a bias, the DC-biased AC voltage 908 remains negative and thus maintains a reverse bias on the PIN junction. A magnitude of the reverse bias DC voltage 904 substantially greater than an amplitude of the AC voltage can therefore ensure that the BJT remains reverse biased and does not get stuck in an on-state or a partially on-state.

Along these same lines, in an embodiment, the forward bias across the PIN junction in the on-state is smaller than the reverse bias in the off-state.

All of the results cited herein were obtained with silicon devices. However, devices manufactured using GaAs, GaN, SiC or any of the other known semiconductor materials can also be used.

Figure 10:
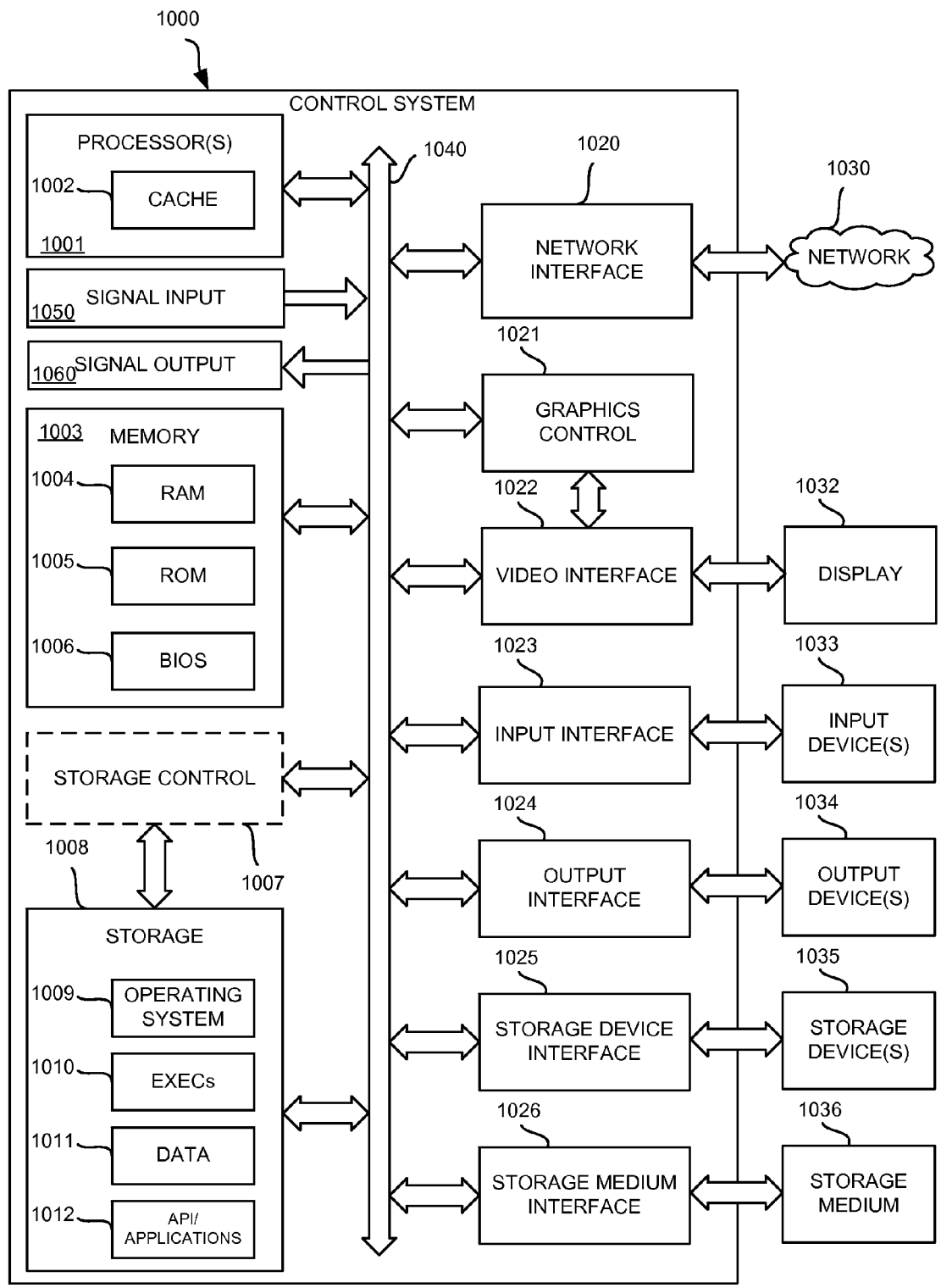
FIG. 10 shows a diagrammatic representation of one embodiment of a control system within which a set of instructions can execute for causing a device to perform or execute any one or more of the aspects and/or methodologies of the present disclosure

The systems and methods described herein can be implemented in connection with a control and processing components in addition to the specific physical devices previously described herein. FIG. 10 shows a diagrammatic representation of one embodiment of a control system 1000 within which a set of instructions can execute for causing a device to perform or execute any one or more of the aspects and/or methodologies of the present disclosure. For example, the control system 1000 may be utilized to realize a control component for controlling biases between terminals of the three-terminal PIN devices discussed above. But the components in FIG. 10 are examples only and do not limit the scope of use or functionality of any hardware, software, firmware, embedded logic component, or a combination of two or more such components implementing particular embodiments of this disclosure. Some or all of the illustrated components can be part of the control system 1000. For instance, the control system 1000 can include a general purpose computer or an embedded logic device (e.g., an FPGA), to name just two non-limiting examples.

Control system 1000 in this embodiment includes at least a processor 1001 such as a central processing unit (CPU) or an FPGA to name two non-limiting examples. The control system 1000 may also comprise a memory 1003 and storage 1008, both communicating with each other, and with other components, via a bus 1040. The bus 1040 may also link a display 1032, one or more input devices 1033 (which may, for example, include a keypad, a keyboard, a mouse, a stylus, etc.), one or more output devices 1034, one or more storage devices 1035, and various non-transitory, tangible processor-readable storage media 1036 with each other and with one or more of the processor 1001, the memory 1003, and the storage 1008. All of these elements may interface directly or via one or more interfaces or adaptors to the bus 1040. For instance, the various non-transitory, tangible processor-readable storage media 1036 can interface with the bus 1040 via storage medium interface 1026. Control system 1000 may have any suitable physical form, including but not limited to one or more integrated circuits (ICs), printed circuit boards (PCBs), mobile handheld devices, laptop or notebook computers, distributed computer systems, computing grids, or servers.

Processor(s) 1001 (or central processing unit(s) (CPU(s))) optionally contains a cache memory unit 1002 for temporary local storage of instructions, data, or processor addresses. Processor(s) 1001 are configured to assist in execution of non-transitory processor-readable instructions stored on at least one non-transitory, tangible processor-readable storage medium. Control system 1000 may provide functionality as a result of the processor(s) 1001 executing instructions embodied in one or more non-transitory, tangible processor-readable storage media, such as memory 1003, storage 1008, storage devices 1035, and/or storage medium 1036 (e.g., read only memory (ROM)). For instance, instructions to effectuate one or more steps of the method described with reference to FIG. 8 may be embodied in one or more non-transitory, tangible processor-readable storage media and processor(s) 1001 may execute the instructions. Memory 1003 may read the instructions from one or more other non-transitory, tangible processor-readable storage media (such as mass storage device(s) 1035, 1036) or from one or more other sources through a suitable interface, such as network interface 1020. Carrying out such processes or steps may include defining data structures stored in memory 1003 and modifying the data structures as directed by the software.

The signal input component 1050 generally operates to receive signals (e.g., digital and/or analog signals) that provide information about one or more aspects of the three-terminal PIN and/or biases applied to the terminals thereof.

The signal output component 1060 may include digital-to-analog components known to those of ordinary skill in the art to generate switch control signals to control switching of biases applied to the terminals.

The memory 1003 may include various components (e.g., non-transitory, tangible processor-readable storage media) including, but not limited to, a random access memory component (e.g., RAM 1004) (e.g., a static RAM "SRAM", a dynamic RAM "DRAM, etc.), a read-only component (e.g., ROM 1005), and any combinations thereof. ROM 1005 may act to communicate data and instructions unidirectionally to processor(s) 1001, and RAM 1004 may act to communicate data and instructions bidirectionally with processor(s) 1001. ROM 1005 and RAM 1004 may include any suitable non-transitory, tangible processor-readable storage media described below. In some instances, ROM 1005 and RAM 1004 include non-transitory, tangible processor-readable storage media for carrying out the methods described herein.

Fixed storage 1008 is connected bidirectionally to processor(s) 1001, optionally through storage control unit 1007. Fixed storage 1008 provides additional data storage capacity and may also include any suitable non-transitory, tangible processor-readable media described herein. Storage 1008 may be used to store operating system 1009, EXECs 1010 (executables), data 1011, API applications 1012 (application programs), and the like. Often, although not always, storage 1008 is a secondary storage medium (such as a hard disk) that is slower than primary storage (e.g., memory 1003). Storage 1008 can also include an optical disk drive, a solid-state memory device (e.g., flash-based systems), or a combination of any of the above. Information in storage 1008 may, in appropriate cases, be incorporated as virtual memory in memory 1003.

In one example, storage device(s) 1035 may be removably interfaced with control system 1000 (e.g., via an external port connector (not shown)) via a storage device interface 1025. Particularly, storage device(s) 1035 and an associated machine-readable medium may provide nonvolatile and/or volatile storage of machine-readable instructions, data structures, program modules, and/or other data for the control system 1000. In one example, software may reside, completely or partially, within a machine-readable medium on storage device(s) 1035. In another example, software may reside, completely or partially, within processor(s) 1001.

Bus 1040 connects a wide variety of subsystems. Herein, reference to a bus may encompass one or more digital signal lines serving a common function, where appropriate. Bus 1040 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Control system 1000 may also include an input device 1033. In one example, a user of control system 1000 may enter commands and/or other information into control system 1000 via input device(s) 1033. Examples of an input device(s) 1033 include, but are not limited to, a touch screen, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 1033 may be interfaced to bus 1040 via any of a variety of input interfaces 1023 (e.g., input interface 1023) including, but not limited to, serial, parallel, game port, USB, FIREWIRE, THUNDERBOLT, or any combination of the above.

Information and data can be displayed through a display 1032. Examples of a display 1032 include, but are not limited to, a liquid crystal display (LCD), an organic liquid crystal display (OLED), a cathode ray tube (CRT), a plasma display, and any combinations thereof. The display 1032 can interface to the processor(s) 1001, memory 1003, and fixed storage 1008, as well as other devices, such as input device(s) 1033, via the bus 1040. The display 1032 is linked to the bus 1040 via a video interface 1022, and transport of data between the display 1032 and the bus 1040 can be controlled via the graphics control 1021.

In addition or as an alternative, control system 1000 may provide functionality as a result of logic hardwired or otherwise embodied in a circuit, which may operate in place of or together with software to execute one or more processes or one or more steps of one or more processes described or illustrated herein. Moreover, reference to a non-transitory, tangible processor-readable medium may encompass a circuit (such as an IC) storing instructions for execution, a circuit embodying logic for execution, or both, where appropriate. The present disclosure encompasses any suitable combination of hardware in connection with software.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In conclusion, the present invention provides, among other things, a system and method for arc-handling during plasma processing. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A switch comprising:
a collector having a collector terminal;
an emitter having an emitter terminal;
a base coupled to the emitter at a base-emitter junction, the base having a base terminal; and
an intrinsic region arranged between the base and the collector,
an alternating current source arranged to drive an alternating current between the base terminal and the collector terminal;
a controller configured to apply a direct current from the base to the emitter, an amplitude of the direct current controlling an amplitude of the alternating current passing between the base terminal and the collector terminal.

2. The switch of claim 1, wherein a PIN junction comprising the base, intrinsic region, and collector, includes one or more doped regions between the intrinsic region and the collector, where the one or more doped regions have a different p or n concentration than the intrinsic region.

3. The switch of claim 1, wherein a PIN junction comprising the base, intrinsic region, and collector, includes one or more doped regions between the intrinsic region and the base, where the one or more doped regions have a different p or n concentration than the intrinsic region.

4. The switch of claim 1, wherein the collector is an n-type semiconductor, the base is a p-type semiconductor, and the emitter is an n-type semiconductor.

5. The switch of claim 4, wherein the emitter comprises an n++ type semiconductor.

6. The switch of claim 5, wherein the collector comprises an n− type semiconductor.

7. The switch of claim 4, wherein the collector comprises an n− type semiconductor.

8. The switch of claim 4, wherein the intrinsic region is not doped.

9. The switch of claim 4, wherein the intrinsic region is doped, but has a lower p or n concentration than the base.

10. The switch of claim 4, wherein the collector has a lower p or n concentration than the base.

11. The switch of claim 4, wherein the emitter has a higher p or n concentration than the base.

12. The switch of claim 1, wherein the collector is a p-type semiconductor, the base is an n-type semiconductor, and the emitter is a p-type semiconductor.

13. The switch of claim 1, wherein a breakdown voltage of the intrinsic region is greater than or equal to 1000 V.

14. The switch of claim 1, wherein in an on-state a base current passes through the base terminal and a magnitude of the alternating current through the base terminal is greater than a magnitude of a direct current component of the base current.

15. The switch of claim 1, wherein the intrinsic region is dimensioned such that a carrier path length through the intrinsic region between the collector and the base is greater than a carrier path length through the collector.

16. The switch of claim 1, wherein the emitter has a higher p or n concentration than the collector.

17. A switch comprising:
a collector having a collector terminal;
an emitter having an emitter terminal;
a base having a base terminal, the base being coupled to the emitter via a base-emitter junction; and
an intrinsic region arranged between the base and the collector,
an alternating current loop including an alternating current source, the base terminal, and the collector terminal, and further including an alternating current passing through the base terminal and the collector terminal;
a controller configured to apply a direct current from the base terminal to the emitter terminal, an amplitude of the direct current controlling an amplitude of the alternating current passing through the base terminal and the collector terminal,
wherein an amplitude of the alternating current passing through the base terminal and the collector terminal is greater than an amplitude of alternating current passing through the emitter terminal.

18. The switch of claim 17, wherein the emitter has a higher p or n concentration than the collector.

19. A switch comprising:
a collector having a collector terminal;
an emitter having an emitter terminal;
a base coupled to the emitter at a base-emitter junction, the base having a base terminal;
an intrinsic region arranged between the base and the collector;
an alternating current source arranged to generate an alternating current between the collector terminal and the base terminal where the alternating current is substantially the same at the base terminal and the collector terminal; and
a controller configured to apply a direct current from the base to the emitter, an amplitude of the direct current controlling an amplitude of the alternating current passing between the base terminal and the collector terminal.

20. The switch of claim 19, further comprising a biasing circuit comprising:
a first DC source coupled between the emitter terminal and the base terminal;
a second DC source coupled between the collector terminal and the base terminal when the switch is in an off-state and arranged to reverse bias a PIN junction comprising the base, intrinsic region, and collector when the switch is in an off-state.

21. The switch of claim 20, wherein the first DC source is arranged to reverse bias the emitter-base junction when the switch is in an off-state.

22. The switch of claim 19, wherein the first DC source is arranged to forward bias the emitter-base junction when the switch is in an on-state.

* * * * *